United States Patent [19]

Uratsuji et al.

[11] Patent Number: 5,320,550

[45] Date of Patent: Jun. 14, 1994

[54] CONNECTOR FOR ELECTRIC PART

[75] Inventors: Kazumi Uratsuji, Tokyo; Ryuichi Nakamura, Kawasaki; Noriyuki Matsuoka, Yokohama, all of Japan

[73] Assignee: Yamaichi Electric Co., Ltd., Tokyo, Japan

[21] Appl. No.: 922,769

[22] Filed: Jul. 31, 1992

[30] Foreign Application Priority Data

Aug. 13, 1991 [JP] Japan .................... 3-228377

[51] Int. Cl.$^5$ ............................................ H01R 23/72
[52] U.S. Cl. ............................... 439/266; 439/330
[58] Field of Search ....................... 439/265–268, 439/330, 331, 342, 68, 72, 73, 71; 324/158

[56] References Cited

U.S. PATENT DOCUMENTS

| | | | |
|---|---|---|---|
| 4,717,347 | 1/1988 | Babow et al. | 439/330 |
| 4,789,345 | 12/1988 | Carter | 439/330 |
| 4,993,955 | 2/1991 | Savant et al. | 439/331 |
| 5,020,998 | 6/1991 | Ikeya et al. | 439/330 |
| 5,037,321 | 8/1991 | Uratsuji | 439/342 |

*Primary Examiner*—Larry I. Schwartz
*Assistant Examiner*—Hien D. Vu
*Attorney, Agent, or Firm*—Wenderoth, Lind & Ponack

[57] ABSTRACT

A connector for an electric part having a contact shutter device for forming an open state or a closed state of a contact, comprising a finger-like latch member able to be engaged with and disengaged from an electric part, the finger-like latch member being operatively connected to an action of the contact shutter device for displacing a contact in an open state in order to be disengaged from the electric part, the finger-like latch member being operatively connected to an action of the contact shutter device for displacing the contact in a closed state in order to be engaged with the electric part.

5 Claims, 11 Drawing Sheets

CONNECTOR FOR ELECTRIC PART

BACKGROUND OF THE INVENTION

1. Field of the Invention

This invention relates to a connector for an electric part, in which a finger-like latch member on a socket body is brought into engagement with an electric part for maintaining a contacting relation.

2. Brief Description of the Prior Art

In a conventional connector, contact elements of an electric part such as a leadless IC are placed on the free ends of contacts of a connector in order to obtain a contacting pressure. In order to maintain this pressure-contacting state, a presser cover is mounted on one end of the connector such that the presser cover can be opened and closed. By closing the presser cover against an upper surface of the connector and maintaining the closed state of the cover by a lock lever mounted on the other end of the connector, the IC is held and the contacting pressure is obtained.

However, when such a presser cover is used, it is required to open and close the cover and to lock the cover every time an IC is mounted on and removed from the connector. This lowers working efficiency.

Recently, the work of mounting and removing an IC onto and from the connector is usually performed automatically. However, in the above conventional connector having the construction in which the presser cover is closed and locked by the lock member, it is difficult to automatically perform the work of mounting and removing the IC onto and from the connector. Furthermore, the presser cover is readily turned up or warped upward by the elastic force of the contacts, which makes it difficult to obtain a uniform contacting pressure. In addition, this conventional device has the problem that the presser cover prevents thermal emission from the IC.

SUMMARY OF THE INVENTION

It is therefore an object of the present invention to provide, in order to solve the above problems, a connector for an electric part, in which a finger-like latch member is operatively connected to a contact shutter means so that the finger-like latch member can be engaged with and disengaged from an electric part.

To achieve the above object, according to the present invention, a connector for an electric part having contact shutter means for forming an open state or a closed state of a contact, comprises a finger-like latch member able to be engaged with and disengaged from an electric part, the finger-like latch member being operatively connected to a contact shutter means for displacing a contact in an open state in order to be disengaged from the electric part, the finger-like latch member being operatively connected to the contact shutter means for displacing the contact in a closed state in order to be engaged with the electric part.

In the present invention thus constructed, when the contact shutter means is operated to displace the contact to a closed state, the finger-like latch member, which is operatively connected to the contact shutter means, is brought into engagement with the electric part thereby to maintain a contacting state between the contact element of the electric part and the contact. On the other hand, when the contact shutter means is operated to displace the contact into the open state, the finger-like latch member, which is operatively connected to the contact shutter means, is disengaged from the electric part to permit the electric part to be removed from or mounted in the connector.

DETAILED DESCRIPTION OF THE EMBODIMENTS

Figure 1:
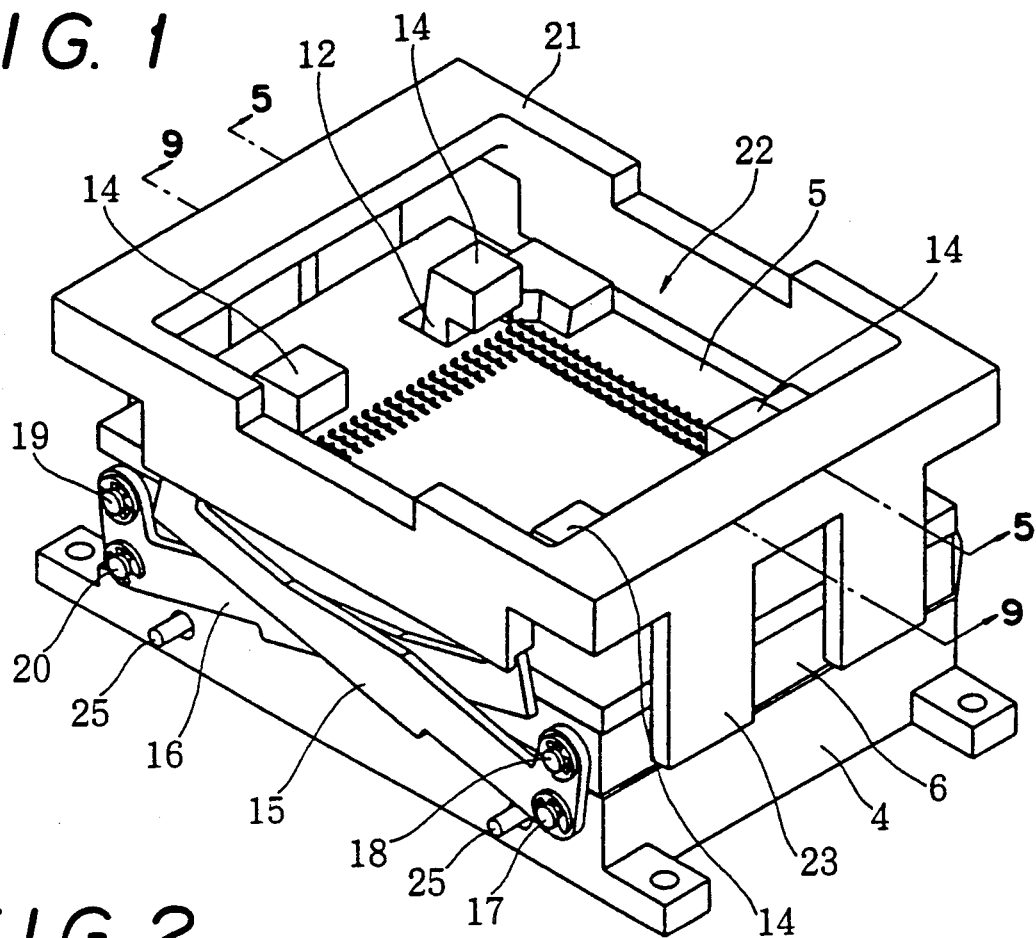
FIG. 1 is a perspective view of a connector for an electric part according to one embodiment of the present invention, in which a contact is opened and closed by an operating lever, and in which an upper operating member is in an upper position.
Figure 2:
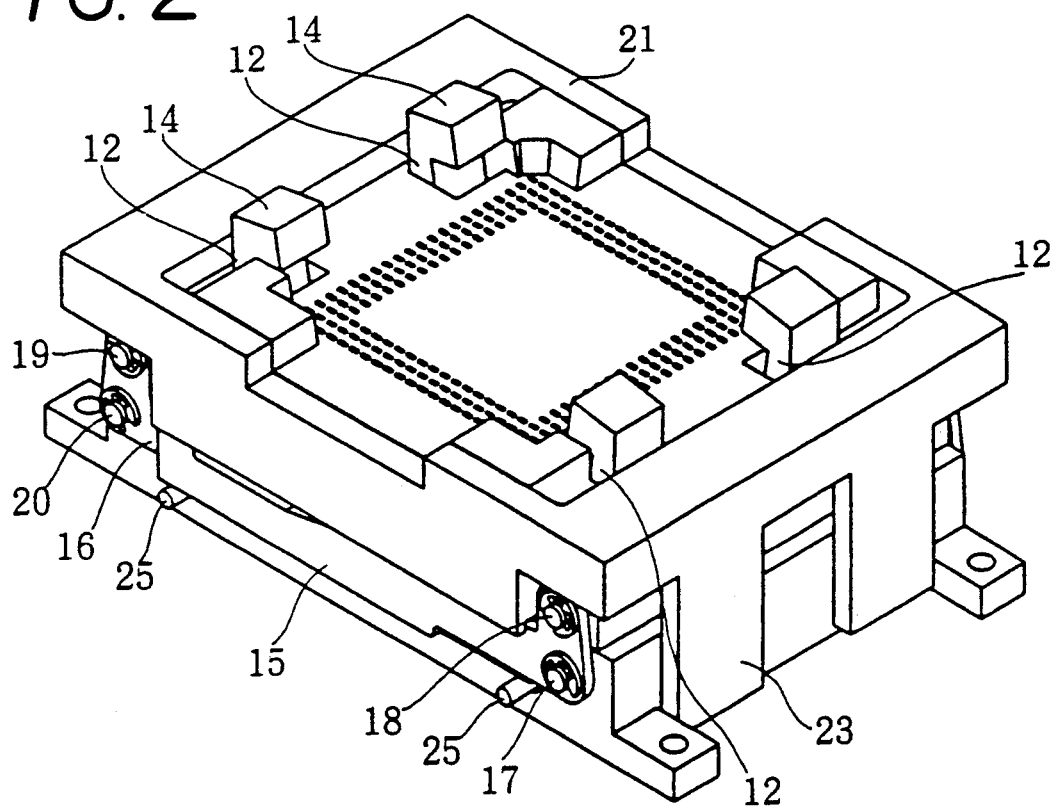
FIG. 2 is a perspective view, similar to FIG. 1, but in which the upper operating member is in a lower position.
Figure 3:
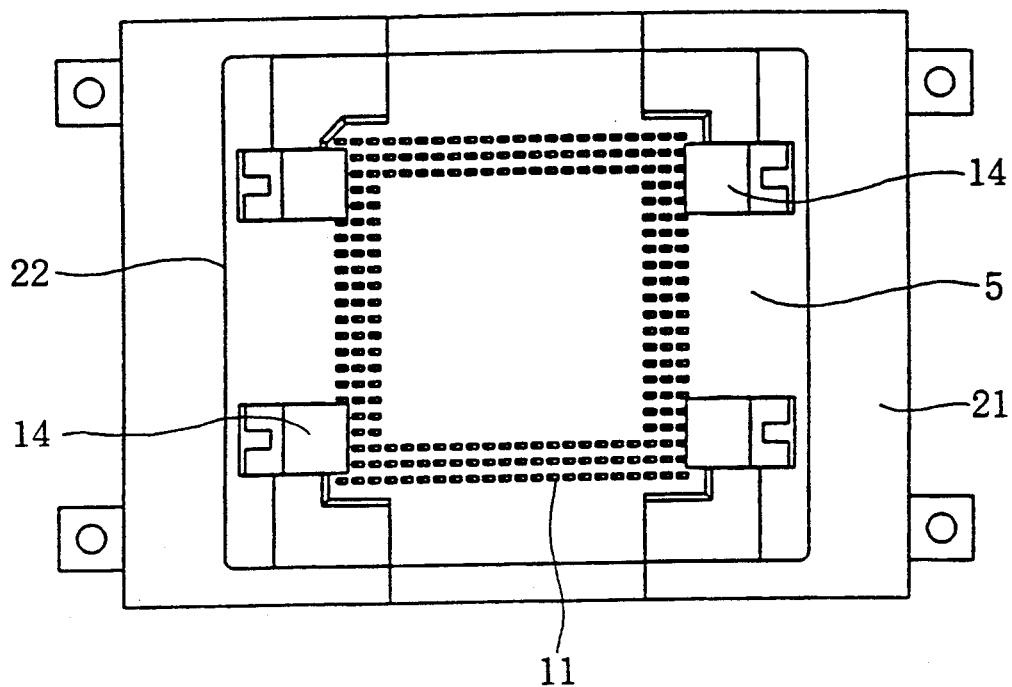
FIG. 3 is a plan view of the connector as shown in FIG. 1.
Figure 4:
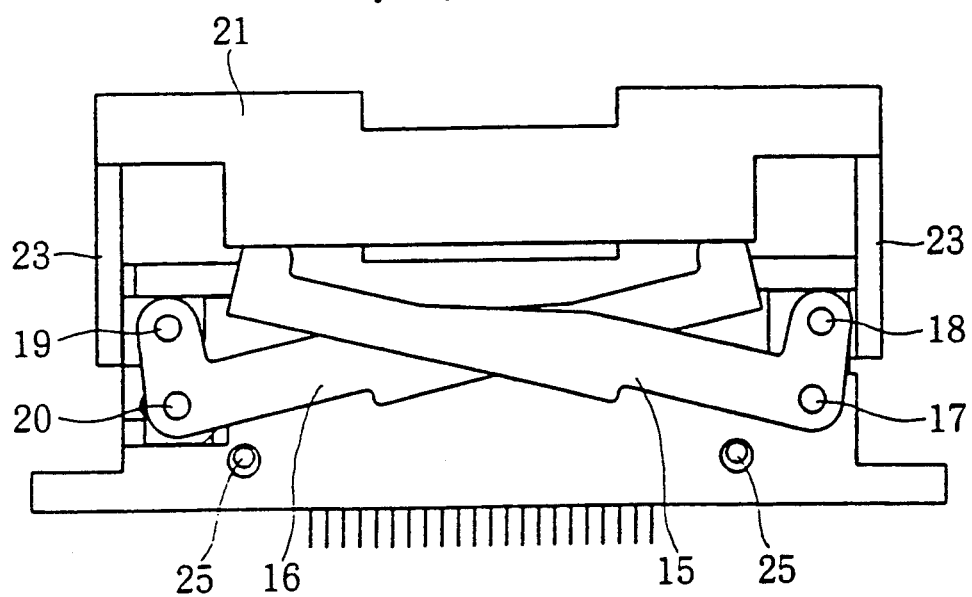
FIG. 4 is a side view of the connector as shown in FIG. 1.

Several embodiments of the present invention will now be described with reference to FIGS. 1 through 22.

FIRST EMBODIMENT (see FIGS. 1–10 inclusive)

This embodiment shows a connector for the use of a leadless IC 1 as an electric part. This IC has a plurality of contact elements 2 on a lower surface thereof. Each of the contact elements 2 is placed against an upper end of a corresponding contact so as to be pressure-contacted therewith.

The connector comprises a base plate 4 formed of an insulating material and having a plurality of contacts each formed of a spring element 3, mounted therein, a braking plate 5 formed of an insulating material and disposed at a position spaced above the base plate 4, and a moving plate 6 interposed between the braking plate 5 and the base plate 4. The moving plate 6 is operated to move between the base plate 4 and the braking plate 5 in such a manner as to be in parallel relation therewith. This moving plate 6 acts as a shutter means for opening and closing the spring elements 3 in accordance with the movement of the moving plate 6.

The base plate 4, the braking plate 5, and the moving plate 6 are formed as separate parts, and arranged in parallel relation with one another. Alternatively, the base plate 4 and the braking plate 5 may be integrally formed as a single part, and the moving plate 6 formed as a separate part and interposed between the base plate 4 and the braking plate 5.

The base plate 4, the braking plate 5, and the moving plate 6 are arranged in spaced parallel relation as illustrated, or they are disposed in superposed relation.

Figure 5:
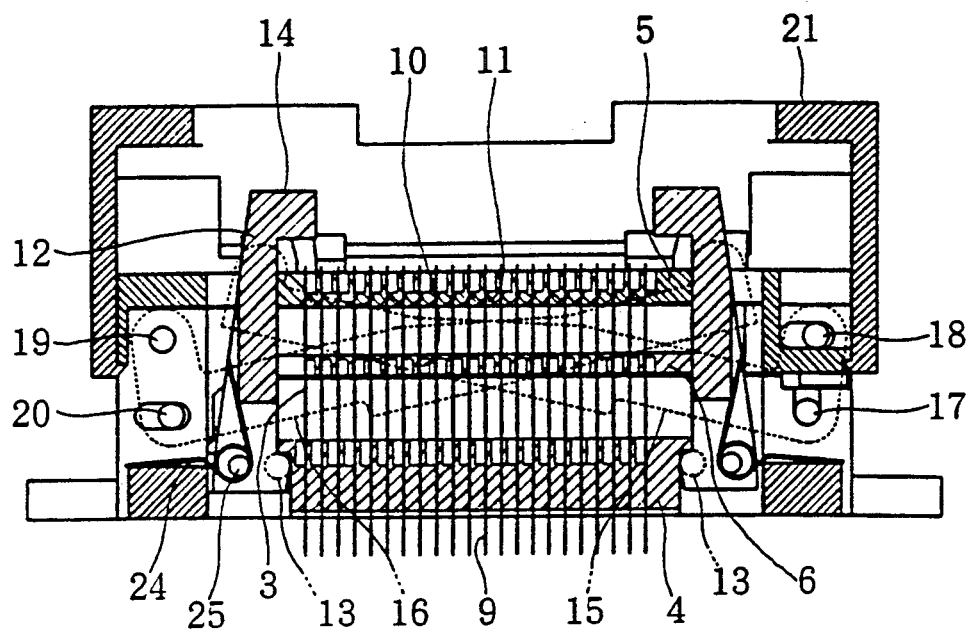
FIG. 5 is a sectional view of the connector taken on line 5—5 of FIG. 1.
Figure 6:
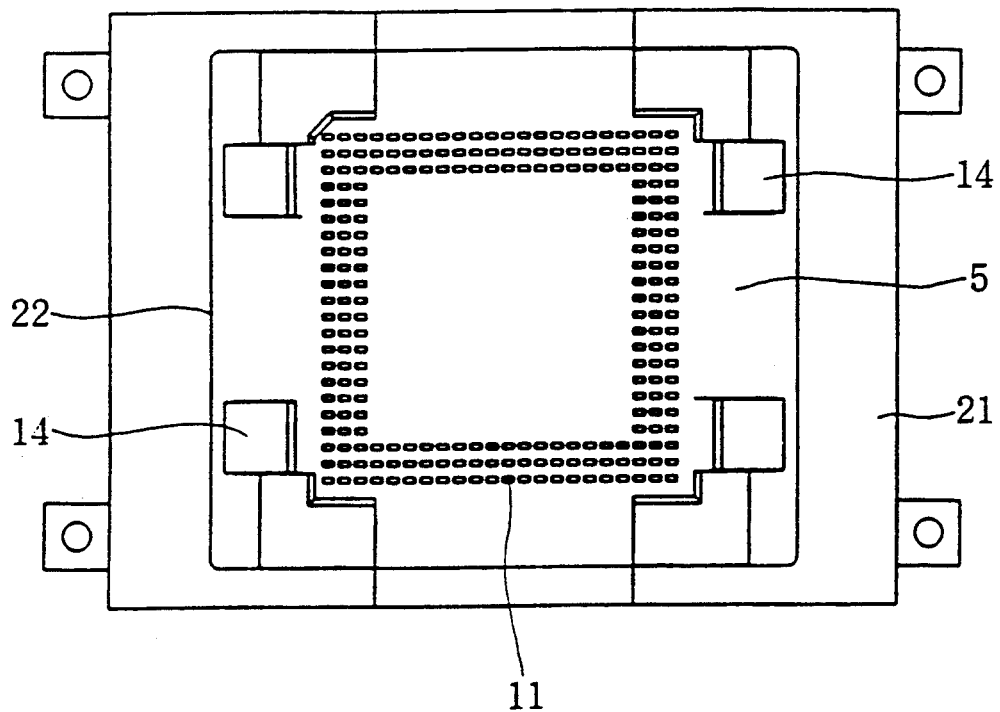
FIG. 6 is a plan view of the connector as shown in FIG. 2.
Figure 7:
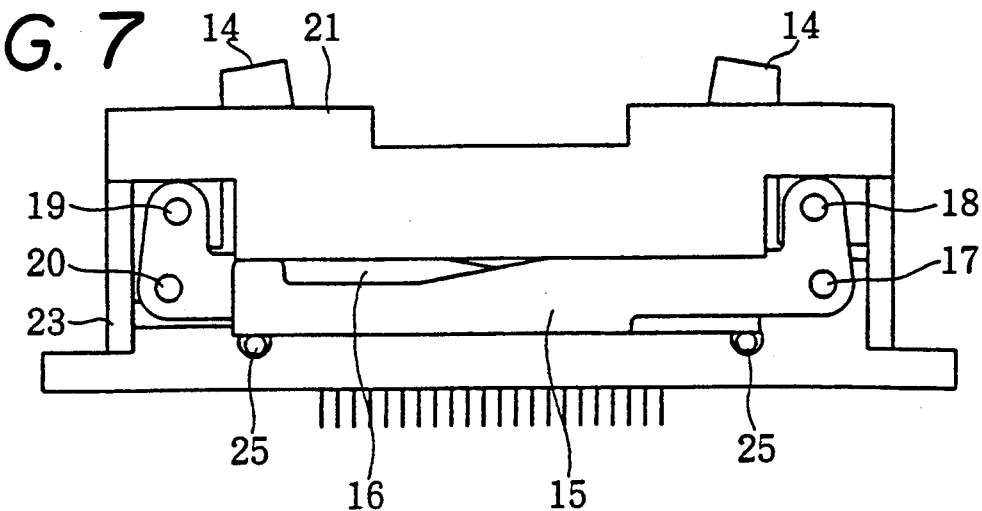
FIG. 7 is a side view of the connector as shown in FIG. 2.

The contact formed of the spring element 3 is mounted in the base plate 4, and a lower end of the contact is allowed to project downward of the base plate 4 to form a male terminal 9 which is for connection with a wiring board, etc. The spring element 3 in the base plate 4 extends generally vertically upwardly of the base plate 4 as shown in FIG. 5. A plurality of through-holes 10 adapted to operate the contacts are formed in the moving plate 6, and the spring elements 3 are inserted in the corresponding through-holes 10, respectively. Furthermore, a plurality of through-holes 11 for contact braking are formed in the braking plate 5, so that distal ends of the spring elements 3 extending through the through-holes 10 for operating the contacts 3 are received in the corresponding contact braking through-holes 10. The distal end of each of the spring elements 3 is placed under restriction of the corresponding contract braking through-hole 11, and can be extended and retracted in the vertical direction within the through-hole 11 while a sideward displacement thereof is regulated by an inner wall of the through-hole 11.

Figure 8:
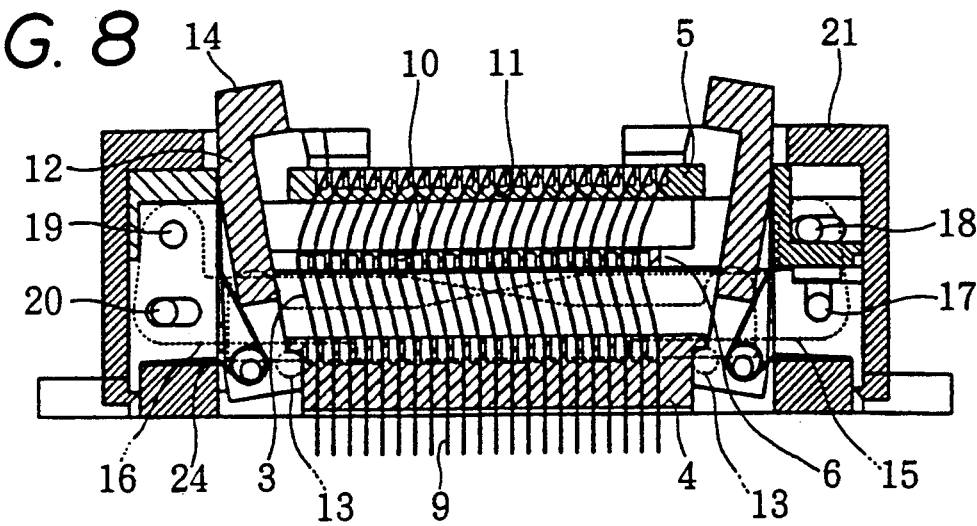
FIG. 8 is a sectional view of the connector as shown in FIG. 2.
Figure 9:
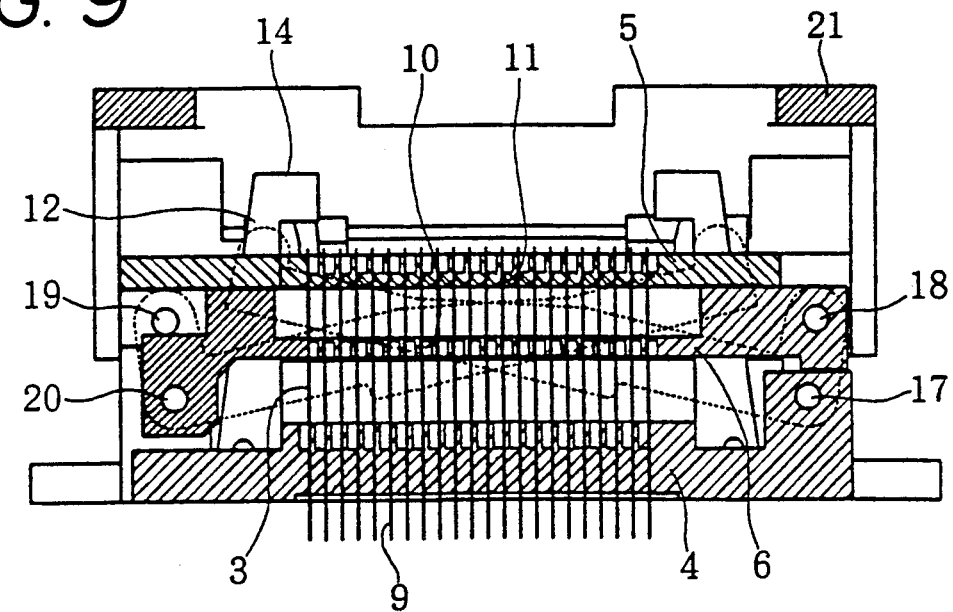
FIG. 9 is a sectional view of the connector taken on line 9—9 of FIG. 1.

As shown in FIG. 8, when the moving plate 6 is laterally moved in one direction, the spring elements 3 have applied a side pressure by the inner walls of the contact operating through-holes 10, respectively. As a result, the spring elements 3 are bent laterally while slidingly contacting the inner wall surfaces of the braking through-holes 11. As a result, the distal ends of the spring elements 3 are retracted downwardly within the through-holes 11 while being braked by the inner walls of the contact braking through-holes 11. In that state, the leadless IC 1 is placed on the upper surface of the braking plate 5 with the contact elements 2 held opposite the contact braking through-holes 11 and the end faces at the distal ends of the spring elements 3. When the leadless IC 1 is placed on the upper surface of the braking plate 5, the contact elements 2 are in contacting or non-contacting relation with the distal ends of the spring elements 3, respectively. The braking plate 5 constitutes a platform for mounting the electric part thereon as mentioned.

Figure 10:
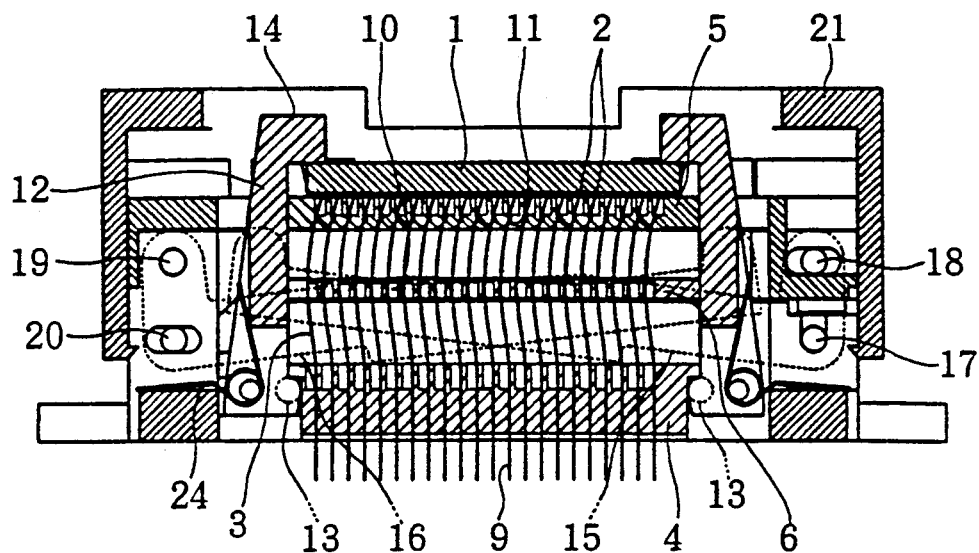
FIG. 10 is a sectional view of the connector taken on line 5—5 of FIG. 1, but showing the contact in pressure-contact with an IC.

When the moving plate 6 is laterally moved in the other direction after the leadless IC 1 is placed on the braking plate 5, each of the spring elements 3 is permitted to be restored to its original state. As shown in FIG. 10, the distal end of each of the spring elements 3 is extended within the corresponding contact braking through-hole 11, owing to the restoration of the spring element 3 to its original shape, and brought into pressure-contact with the contact element 2 placed opposite the contact braking through-hole 11 during the process for restoring the spring element 3. In order to maintain this pressure-contact, finger-like latch members 12 on the base member 4 are brought into engagement with the leadless IC 1 to hold the IC 1.

The finger-like latch members 12 are pivotably mounted on the one end and the other end of the base plate 4 by shafts 13, and extend upward from the pivotal portion thereof. Lock tabs 14 are formed on a foremost end of each finger-like latch member 12, so that the lock tabs 14 are engageable with the one and the other ends of the IC 1 in an engaging position when the IC 1 is placed on the braking plate 5. In other words, when the finger-like latch members 12 are pivoted toward the engaging position about the shafts 13 respectively, the lock tabs 14 are brought into engagement with the IC 1, and when the finger-like latch members 12 are pivoted away from the engaging position, the lock tabs 14 are disengaged from the IC 1. Each of the finger-like latch members 12 is resiliently held by a spring 24 and normally biased toward the other latch member by the spring 24 so that each finger-like latch member 12 is pivoted toward the engaging state. Therefore, when the finger-like latch members 12 are pivoted away from each other against the force of the springs 24, they are disengaged from the IC 1.

A contact shutter means is used as a means for causing the finger-like latch members 12 to be engaged with and disengaged from the IC 1. In other words, the finger-like latch members 12 are operatively connected to the contact shutter means so as to be engaged with and disengaged from the IC 1.

One example of the contact shutter means illustrated in the attached drawings will now be described. The contact shutter means comprises, as already described, the moving plate 6, operating levers 15, 16 as means for laterally moving the moving plate 6, and an upper operating member 21 as means for activating the operating levers 15, 16 and capable of moving in the vertical direction.

More specifically, the contact shutter means comprises the moving plate 6 capable of moving in the lateral direction in order to open and close the spring elements 3 serving as the contacts, and a first operating lever 15 and a second operating lever 16 as means for laterally moving the moving plate 6, a lower part of one end of the first operating lever 15 being pivotably supported by a shaft 17 on one side surface of base plate 4 at one end of the base plate 4, an upper portion of one end of the operating lever 15 being supported by a transmission shaft 18 on the side surface of base plate 4 at one end of the moving plate 6, and on the other hand, an upper portion of one end of the second operating lever 16 being pivotably supported by a supporting shaft 19 on a side surface of the base plate 4 at the other end of the base plate 4, a lower portion of one end of the second operating lever 16 being supported by a transmission shaft 20 on the side surface of the base plate 4 at the other end of the moving plate 6.

The transmission shafts 18, 20 transmit a lateral movement force to the moving plate 6 for movement in one direction when both the first and second operating levers 15, 16 are pivoted downward about the supporting shafts 17, 19, and also transmit a lateral movement force to the moving plate 6 for movement in the other direction when both the first and second operating levers 15, 16 are pivoted upward. In other words, the base plate 4 and the moving plate 6 are supported such that the vertical arrangement of the supporting shaft 17 and the transmission shaft 18 at one end of the first operating lever 15 is in a reverse relation with the vertical arrangement of the supporting shaft 19 and the transmission shaft 20 at one end of the second operating lever 16. Details of the operating lever are shown in U.S. Pat. No. 5,002,499.

The upper operating member 21 is vertically movably disposed at an upper position above the first and second operating levers 15, 16, and is horizontally supported by the first and second operating levers 15, 16. The first and second operating levers 15, 16 extend in the opposite directions to each other along the side surface of the body of the connector. A free end of the first operating lever 15 supports one end of the upper operating member 21, while a free end of the second operating lever 16 supports the other end of the upper operating member 21.

The upper operating member 21 has an opening 22 corresponding to the upper surface of the moving plate 6 and exhibits a frame-shape as a whole. The IC 1 can be inserted and removed through the opening 22. The frame element of the upper operating member 21 is placed on the free ends of the operating levers 15, 16 so as to be horizontally supported thereon.

The upper operating member 21 is provided with guide elements 23 extending downward from its frame element. The guide elements 23 are disposed along the side surface of the base plate 4 in order to guide a vertical upper and lower part.

When the upper operating member 21 now in an upper position shown in FIG. 1 and FIGS. 3-5 is vertically pushed down by robot means or through manual operation, a downward force is exerted to the operating levers 15, 16 to cause the levers 15, 16 to be pivoted downward about the operating levers 15, 16 as shown in FIGS. 2, and 6-8, the pivotal force being transmitted to the moving plate 6 through the transmission shafts 18, 20 to laterally move the moving plate 6 in one direction along the upper surface of the base plate 4, this lateral movement in turn causing the spring elements 3 forming the contacts to be displaced against their elasticity and retracted to create the above-mentioned open-state.

At the same time, the finger-latch members 12 are pivoted away from the engaging position against the springs 24 through operative connection with the contact shutter means, to thereby move them out of engaging relation with the IC 1. It is preferable to design the connector such that the finger-like latch members 12 move out of the engaging relation with the IC 1 after the spring elements 3 forming the contacts move to the open-state. This prevents a spring-up of the IC 1 due to restoration of the spring elements 3. In the open-state, the IC 1 is inserted and removed under no-load.

When the operating member 21 is released after the IC 1 is placed on the braking plate 5, the moving plate 6 is caused to be laterally moved from the position shown in FIG. 8 to the position shown in FIG. 10 in the opposite direction with respect to the first-mentioned moving direction owing to the elastic restoring force of the spring elements 3 acting as the contacts. Simultaneously, the operating levers 15, 16 and the upper operating member 21 are also restored to the upper positions. The lateral movement of the moving plate 6 in the opposite direction allows the spring elements 3 to be restored toward a straight condition and extended to create a pressure-contacting state with the contact elements 2 of the IC 1.

At the same time, through operative connection with the lateral movement of the moving plate 6 in the opposite direction (that is, the restoring movement of the contact shutter means), the finger-like members 12 are pivoted toward an engaging position under the action of the springs 24 to cause the lock tabs 14 to be engaged with both ends of the IC 1, thereby holding the IC 1 and the pressure-contacting state with the spring elements 3 is maintained. It is preferable that the finger-latch members 12 be brought into engagement with the IC 1 immediately before the spring elements 3 reach the closed state (pressure-contacting state).

The operating levers illustrated are only one example, and other suitable push-down means may be employed for the purpose of laterally moving the moving plate. The operating levers are not necessarily limited to the case where two pairs of left and right operating levers are provided. Only one pair of left and right operating levers may be provided.

The operating member 21 can be vertically lowered by robot means or through manual operation. The operating levers 15, 16 can properly be pivoted downward in accordance with the vertical downward movement of the operating member 21.

As discussed above, the finger-like latch members 12 are opened and closed in operative connection with the contact shutter means. In the first embodiment, the finger-like latch members are engaged and disengaged in operative connection with the operating levers 15, 16 forming the contact shutter means.

More specifically, each of the finger-like latch members 12 is provided at a lower end thereof with a pressure-bearing portion 25 projecting sideward. This pressure-bearing portion 25 is located laterally outwardly of the connector from each pivotal shaft 13 such that the pressure-bearing portion 25 and the lower edges of the free ends of the operating levers 15, 16 are in vertical corresponding relation. The springs 24 used herein are forked springs each of which is mounted about each shaft member forming the pressure-bearing members 25.

When the upper operating member 21 is pushed down to cause the operating levers 15, 16 to be pivoted downward in the manner as already described, the operating levers 15, 16 press the pressure-bearing portions 25 downward so that the finger-like latch members 12 are pivoted away from the engaging position against the springs 24. As a result, the finger-like latch members 12, as shown in FIG. 8, are disengaged from the IC. The downward movements of the operating levers 15, 16 cause the moving plate 6 to be laterally moved in one direction to bend the spring elements 3 in order to create a non-contacting state or contact-released state, and therefore the IC 1 can freely be inserted onto and removed from the upper surface of the braking plate 5. In this case, timing is properly set such that the disengaged states of the finger-like latch members 12 are created immediately after their pressure-contacting states with the IC caused by the spring elements 3 are changed in the manner as already described.

Next, when the push-down force on the upper operating member 21 is released, the moving plate 6 is laterally moved in the other direction owing to the restoring force of the spring elements 3. This lateral moving force of the moving plate 6 is exerted on the transmission shafts 18, 20 of the operating levers 15, 16. As a result, the levers 15, 16 are caused to be pivoted upward, which in turn causes the upper operating member 21 to be pushed upward.

At this time, the spring elements 3, as shown in FIG. 10, are urged to contact the contacting elements 2 of the IC 1 which is placed on the braking plate 5 or platform. The push-down force on the pressure-bearing portions 25 is removed by the upward pivotal movements of the operating levers 15, 16 and the upward movement of the contact shutter means. As a result, the finger-like latch members 12 are pivoted toward each other by the elastic force of the springs 24, so that the lock tabs 14 are engaged with both ends of the IC 1 placed on the upper surface of the braking plate 5.

As a result, the IC 1 is held by the connector, thereby ensuring a pressure-contacting state with each contact element 3.

As described above, the timing is properly set such that the finger latch members 12 are engaged with both ends of the IC 1 immediately before the spring elements 3 are urged to contact with the IC 1. If the spring elements 3 are urged to contact the IC 1 before the finger-like members 12 are engaged with the IC 1, the IC 1 may be idly moved to result in insufficient contact made by the spring elements 3 and insufficient engagement made by the finger-like latch members 12. These problems can be solved by means of the above-mentioned proper timing setting.

Figure 11:
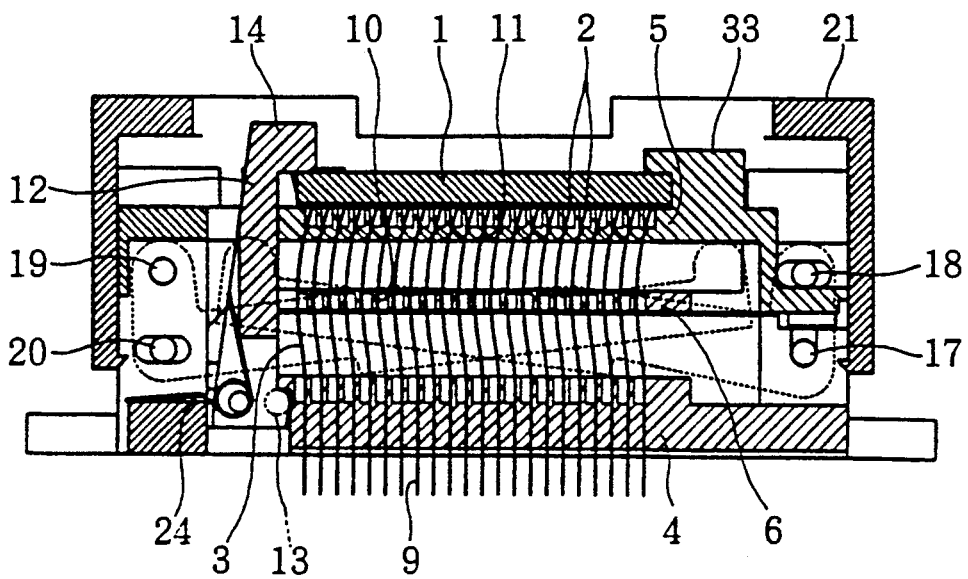
FIG. 11 is a sectional view of a connector having another example of a finger-like latch member.
Figure 12:
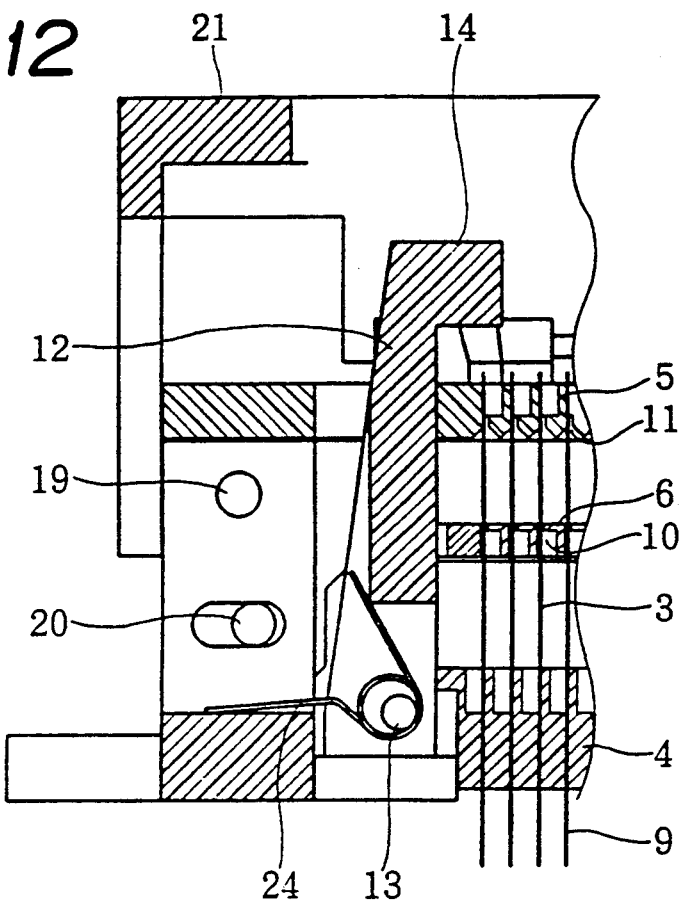
FIG. 12 is an enlarged sectional view of a part of the connector of FIG. 11, showing an embodiment in which the finger-like latch member is engaged and discharged by a moving plate portion, and in which the finger-like latch member is pivoted inward.
Figure 13:
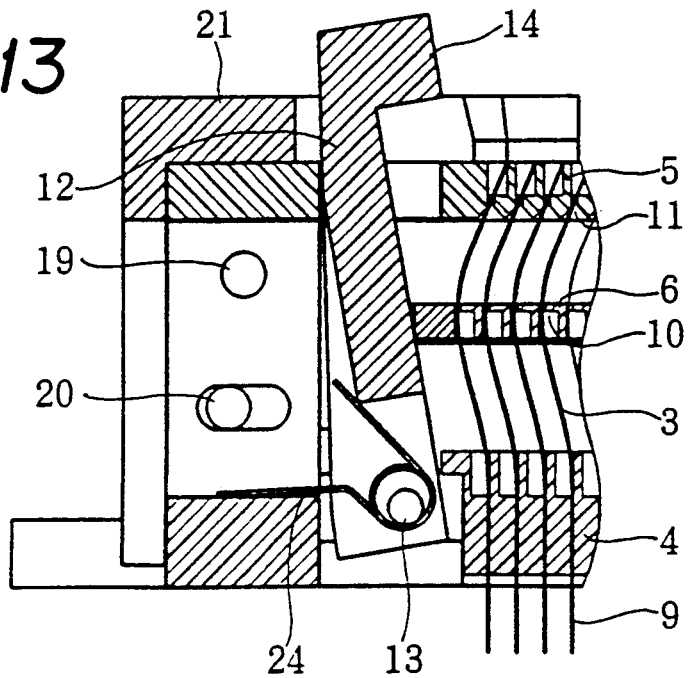
FIG. 13 is a sectional view of similar to FIG. 12 in which the finger-like latch member of FIG. 12 is pivoted outward.

SECOND EMBODIMENT (see FIGS. 11, 12 and 13)

In this embodiment, the engaging state and non-engaging state are created by means of an operative connection between only one finger-like latch member 12 at only one end of the moving plate 6 and the moving plate 6 of the contact shutter means.

As shown, one end portion of the moving plate 6 faces the front edges of the finger-like latch members 12, so that when the moving plate 6 is moved in one direction, the pressing force exerted on the finger-like latch members 12 by the end portion of the moving plate 6 is removed to allow the finger-like latch members 12 to be pivoted toward the engaged position in obedience to the force of the springs, thereby creating the engaging state. When the moving plate 6 is laterally moved in the other direction, the end portion of the moving plate 6 urges the finger-like latch members 12 so that the finger-like latch members 12 are pivoted away from the engaged position against the springs 24 in order to create the non-engaging state or released state.

THIRD EMBODIMENT (see FIGS. 14 to 17)

In this embodiment, the finger-like latch members 12 are operatively connected to the upper operating member 21 forming the contact shutter means, thereby creating the engaging state and released state of each finger-like latch member 12.

Figure 14:
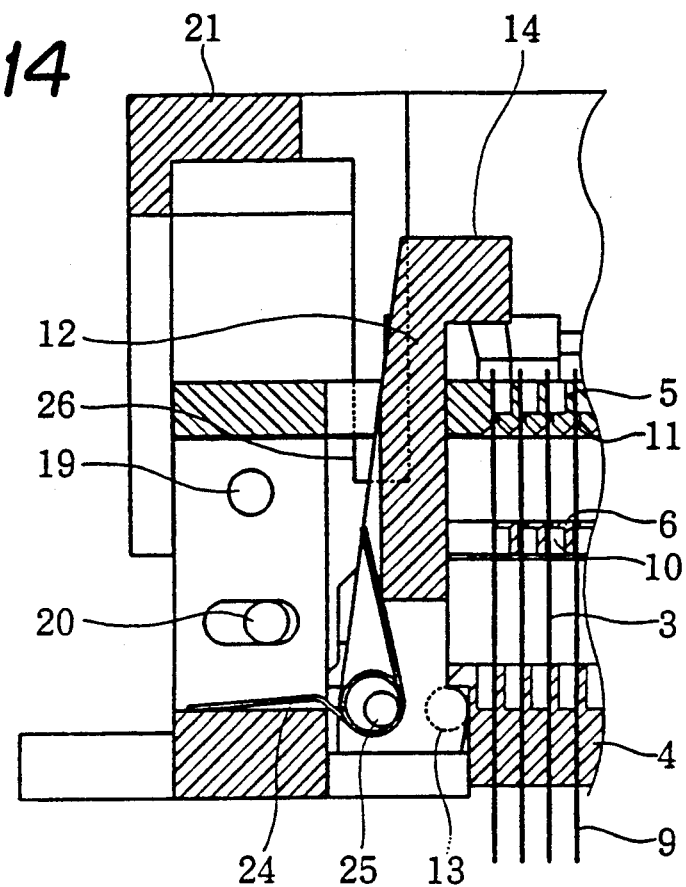
FIG. 14 is an enlarged sectional view of a part of the connector, showing an embodiment in which the finger-like latch member is engaged and disengaged by the upper operating member, and in which the finger-like latch member is pivoted inward.
Figure 15:
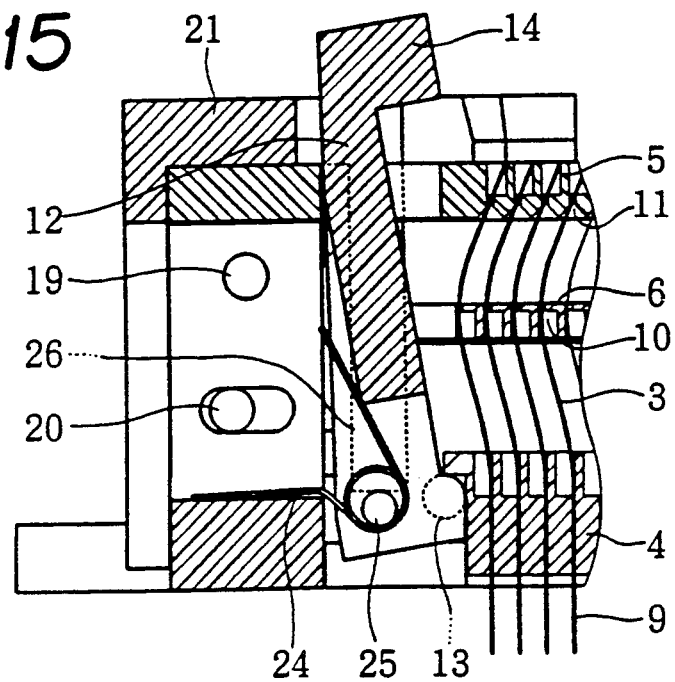
FIG. 15 is a sectional view similar to FIG. 14 in which the finger-like latch member of FIG. 14 is pivoted inward.

In the embodiment as shown in FIGS. 14 and 15, a pressure element 26 is extended downward from the frame element of the upper operating member 21, and a distal end of the pressure element 26 is placed opposite the pressure bearing portion 25.

As shown in FIG. 15, when the upper operating member 21 is pushed down, a push-down force is exerted on the pressure bearing portion 25 by the pressure element 26 in order to pivot the finger-like latch member 12 outward, thereby creating an engagement released state. When the push-down force exerted by the upper operating member 21 is removed, the operating member 21 is automatically moved upward owing to the restoring force of the spring elements acting as the contacts, thereby creating a state where the pressure bearing portion 25 is no longer pushed down by the pressure element 26. As a result, the finger-like latch members 12, as shown in FIG. 14, are pivoted toward the engaging positions by the force of the springs 24, thereby creating an engaging state. The details are the same as those in which the operating levers 15, 16 are acted on by the pressure-bearing portions 25.

Figure 16:
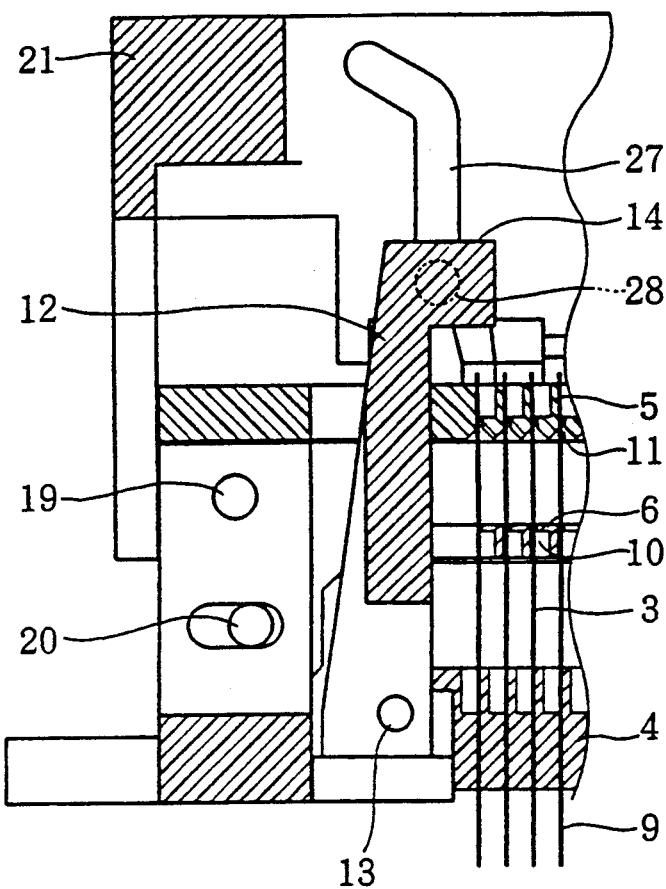
FIG. 16 is an enlarged sectional view of a part of a connector, showing another embodiment in which the finger-like latch member is engaged and disengaged by the operating member, and in which the finger-like latch member is pivoted inward.
Figure 17:
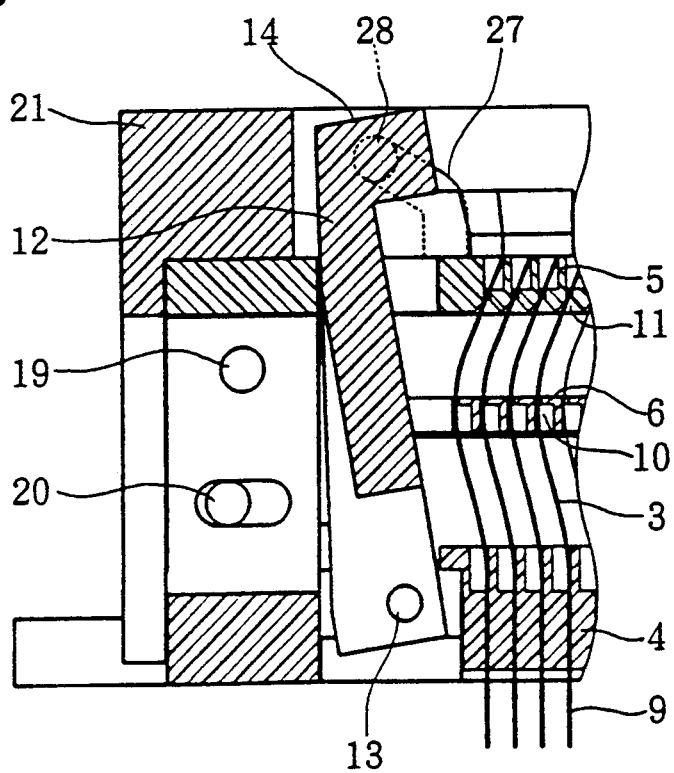
FIG. 17 is a sectional view similar to FIG. 16 in which the finger-like latch member of FIG. 16 is pivoted outward.
Figure 18:
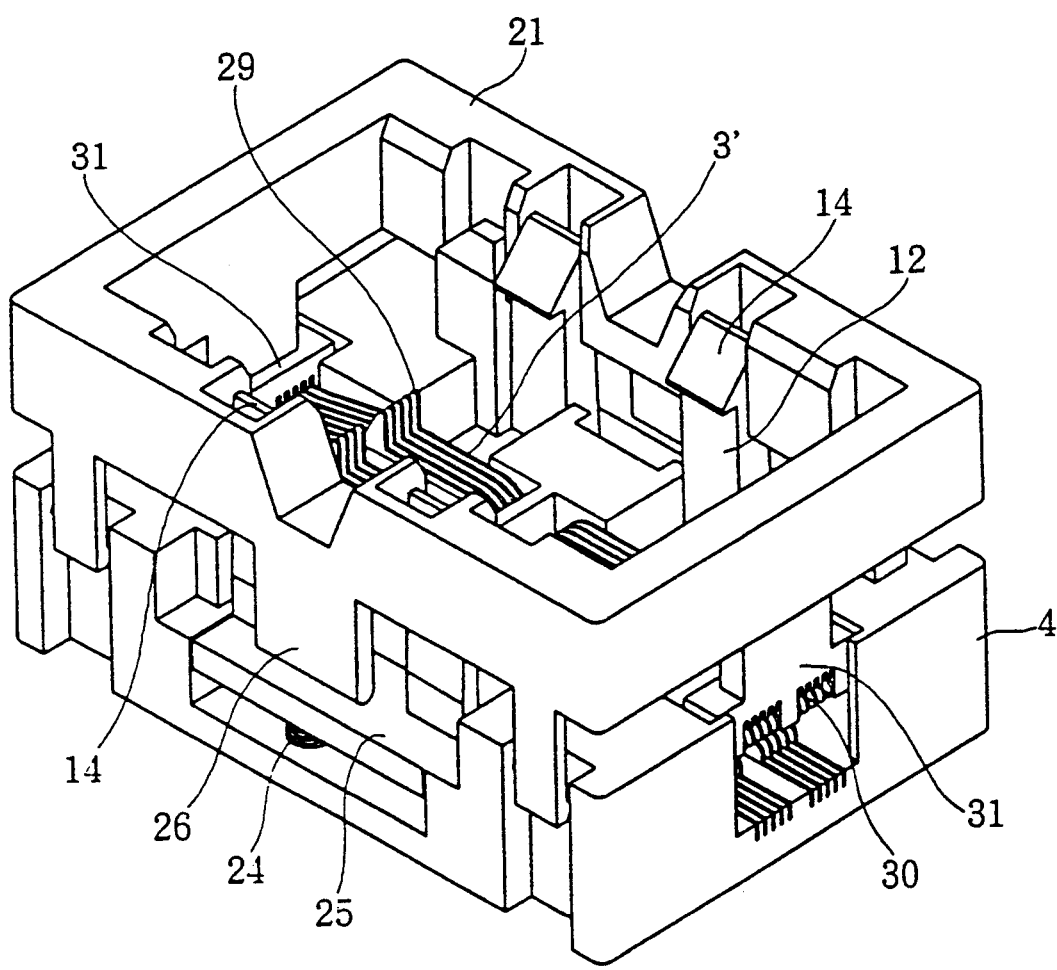
FIG. 18 is a perspective view showing an embodiment of a connector, in which the contact and the finger-like latch member are directly operated by the operating member.

Next, in the embodiment shown in FIGS. 16 and 17, the upper operating member 21 and the finger-like latch members 12 are in cam-engagement with each other, and the finger-like latch members 12 are operatively connected to the vertical movement of the upper operating member 21 so as to be pivoted inward and outward toward and away from the engaging positions. A cam groove 27 is formed, for example, in the upper operating member 21, and the finger-like latch member 12 is provided with a slider 28 adapted to be slidingly fitted into this cam groove 27, so that the slider 28 is moved along a locus of the cam groove 27 in accordance with the vertical movement of the upper operating member 21, thereby causing the finger-like latch member 12 to be pivoted inward and outward. Of course, the connector may be designed such that the cam groove 27 is formed in the finger-like latch member 12, and the slider 28 is disposed on the upper operating member 21.

FOURTH EMBODIMENT (see FIGS. 18-22)

In this embodiment, each spring element 3' forming a contact is opened and closed directly by the upper operating member 21, which also causes opening and closing of the finger-like latch member 12. Therefore, the moving plate 6 and the operating levers 15, 16 as provided in the first through third embodiments are not required.

Each spring element 3' is fixedly mounted at its basal portion in the base plate 4 and extended laterally outwardly from the basal portion side, so that a free end of the spring element 3' can be flexed upwardly and downwardly about the basal portion side. Each spring element 3, is provided with a projection 29 projecting an intermediate portion thereof and adapted to contact the IC 1. Each spring element 3' is further provided at its free end with a pressure bearing portion 30 which is subjected to the push-down force of the upper operating member 21.

As means for pushing down the pressure-bearing portion 30, the upper operating member 21 is provided with a pressure element 31 extending, for example, downward from the frame element of the upper operating member 21, so that a lower end of the pressure element 31 acts on the pressure-bearing portion 30. As a suitable example, the pressure element 31 is placed on the pressure-bearing portion 30 so that the upper operating member 21 is supported by the spring element 3'. On the other hand, the upper operating member is provided with the pressure element 26 directed downward from the frame element, and the pressure element 26 is placed above a pressure-bearing portion 25 disposed at an outer side of the basal end of the finger-like latch member 12 in such a manner as to face the pressure-bearing portion 25 when the pressure-bearing portion 25 is pushed down in accordance with a downward movement of the upper operating member 21.

Figure 19:
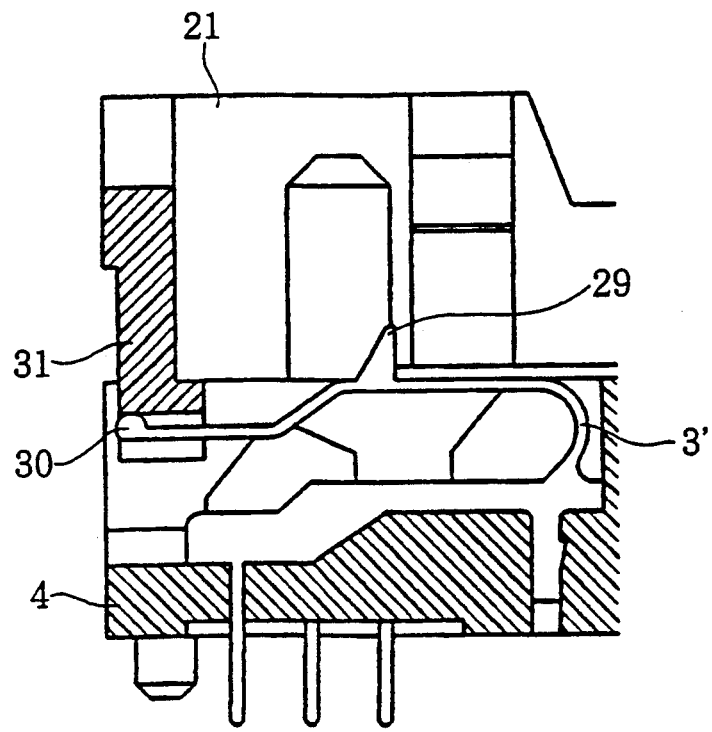
FIG. 19 is an enlarged sectional view of a part of the connector of FIG. 18, in which the contact is displaced upward.
Figure 20:
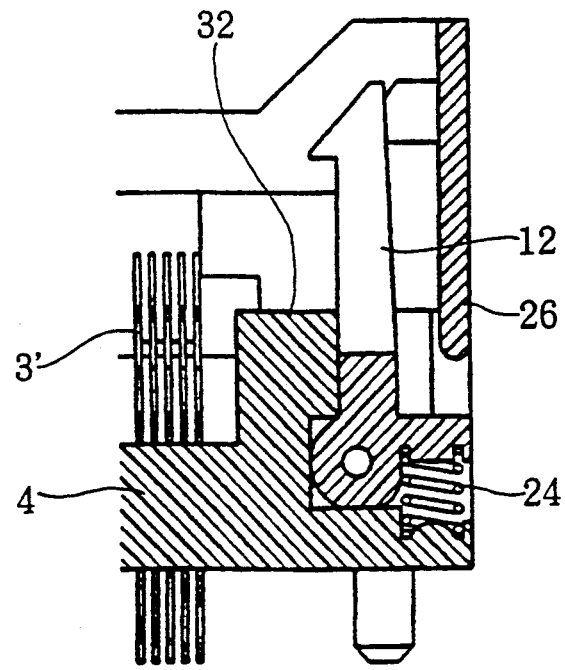
FIG. 20 is an enlarged sectional view of a part of the connector of FIG. 18, in which the finger-like latch member is pivoted inward.
Figure 21:
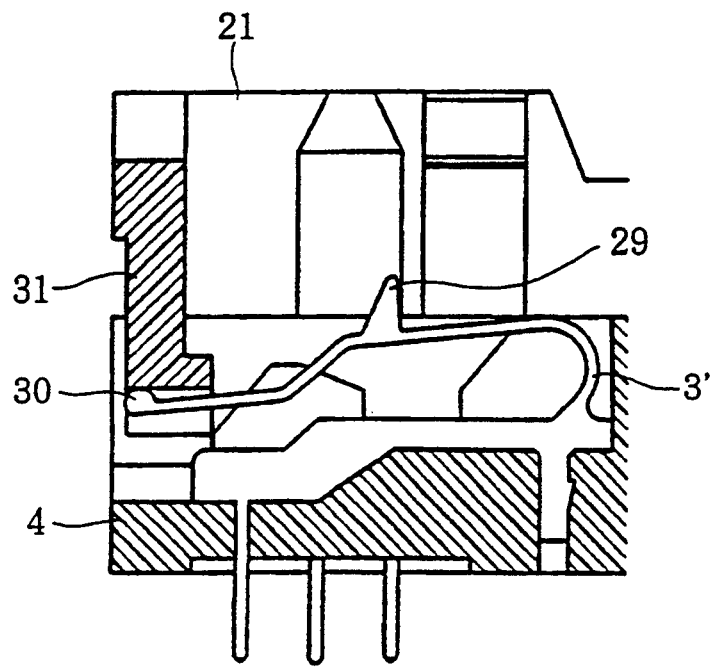
FIG. 21 is an enlarged sectional view of a part of the connector of FIG. 18, in which the contact is displaced downward.
Figure 22:
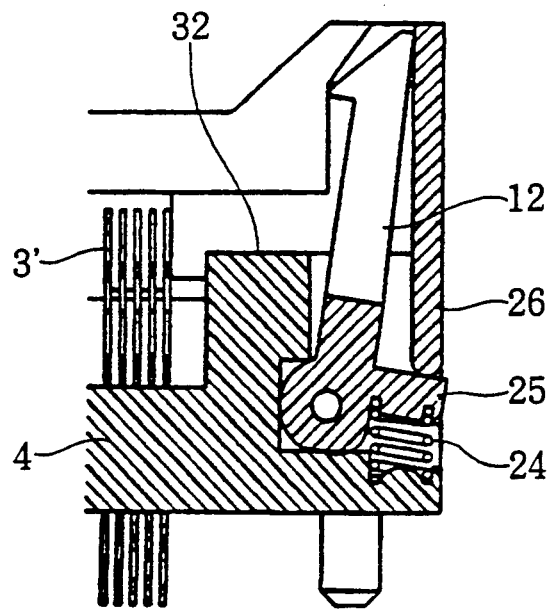
FIG. 22 is an enlarged sectional view of a part of the connector of FIG. 18, in which the finger-like latch member is displaced outward.

As shown in FIG. 19, when the upper operating member 21 is in an upper position supported by the spring elements 3', the finger-like latch member 12, as shown in FIG. 20, is in a position pivoted inwardly toward an engaging position by the spring 24. In the state shown in FIGS. 19 and 20, when the upper operating member 21 is pushed down, the pressure element 31 pushes down the pressure-bearing portion 30 as shown in FIG. 21, and therefore the spring elements 3' are displaced downward. As a result, the contacting projections 29 are displaced downward to create a released state, as shown in FIG. 21, and the pressure element 26 of the upper operating member 21 operatively connected thereto is caused to push down the pressure-bearing portion 25, so that the finger-like latch member 12 is pivoted outward toward a disengaging position against the action of spring 24 in order to be disengaged from the IC 1, as shown in FIG. 22. In this state, the IC 1 is inserted and removed. The IC 1 is supported on a platform 32 formed on the upper surface of the base plate 4, and a finger-like latch member 12 is engaged with and disengaged from both ends of the IC 1 supported on the platform 32.

When the push-down force on the upper operating member 21 is released when the parts are in the state shown in FIGS. 21 and 22, the spring element 3' is restored and displaced upward. This causes the upper operating member 21 supported by the pressure-bearing portion 30 to be pushed up. During the restoring process of the spring element 3' in the upward direction, the contacting projection 29 is urged to contact the corresponding contact element (not shown) of the IC 1 supported on the platform 1.

The pressure on the pressure-bearing portion 25 is removed by the upward movement of the upper operating member 21. As a result, the finger-like latch member 12 is pivoted inward toward the engaging position in obedience to the spring 24, so that the finger-like latch member 12 is brought into engagement with the end portion of the IC 1, thereby maintain the pressure contacting state of the spring element 3'. As already mentioned, it is preferable that timing be properly set such that the finger-like latch member 12 is brought into engagement with the end portion of the IC immediately before the spring element 3' is urgedly contacted with the contact element of the IC 1, and that the finger-like latch member 12 is disengaged from the end portion of the IC 1 after the spring element 3' separates from the pressure contact with the contact element of the IC 1.

FIFTH EMBODIMENT (see FIG. 11)

A pair of the finger-like latch members 12 may be employed so that they can be engaged with both ends of the IC 1. However, as shown in FIG. 11, the device can also be designed such that a finger-like latch member 12 is operatively connected to the contact shutter means so that it can be engaged with and disengaged from one end of the IC 1, and when the IC 1 is placed on the connector, the other end of the IC 1 is engaged by other means.

As one example, the braking plate 5 serving as the platform for the IC 1 is provided, as shown, at an end portion thereof with a temporary engaging portion 33 so that one end portion of the IC 1 can be engaged thereunder, and thereafter the finger-like latch member 12 operatively connected to the contact shutter means is brought into engagement with the other end portion of the IC 1. This embodiment can be employed, for example, as part of the second embodiment shown in FIGS. 12 and 13. Specifically, owing to the lateral movement of the moving plate 6 in one direction, the finger-like latch member 12 to be engaged with one end of the IC 1 can be activated, and the other end of the IC can be engaged by the temporary engaging portion 33 which is engaged with the IC 1 when the IC 1 is placed.

According to the present invention, the first through fifth embodiments may properly be combined for use.

According to the present invention, the finger-like latch member can be automatically engaged with and disengaged from the electric part through operative connection to the operation in which the contacts are displaced between a contacting state and a released state by the contact shutter means. That is, while creating the closed state of the contact by means of operation of the contact shutter means, the finger-like latch member is brought into engagement with the IC through operative connection thereto, in order to hold the electric part on the connector and to maintain pressure contact between the electric part and the contact.

When the contact is displaced into an open state by means of operation of the contact shutter means, the engagement of the finger-like latch member with the electric part can be automatically disengaged through operative connection thereto. As a result, the electric part can be removed and a new one inserted immediately.

By means of the above procedures, the above-described problems inherent in the conventional presser cover can be obviated effectively.

What is claimed is:

1. A connector for an electric part, comprising:
    contacts movable between a closed position in which said contacts contact electrodes of an electric part positioned in a part holding position in said connector, and an open position spaced from said closed position and out of contact with the electrodes of an electric part positioned in said part holding position;
    contact shutter means operatively connected to said contacts for moving said contacts between the open position and the closed position and having a moving plate reciprocally movable laterally in the plane of said moving plate for moving said contacts between the open and closed positions;

at least one finger-like latch member mounted in said connector for movement from an engaged position in which a part of said latch member is engaged over the electric part for holding it in the part holding position and a disengaged position in which said latch member is moved away from said part holding position to permit movement of the electric part into and out of said part holding position;

said latch member being operatively engaged by said moving plate for being moved to said disengaged position when said moving plate moves said contacts to the open position and for being released by said moving plate to be moved to the engaged position when said moving plate moves said contacts to the closed position.

2. A connector for an electric part, comprising:

contacts movable between a closed position in which said contacts contact electrodes of an electric part positioned in a part holding position in said connector, and an open position spaced from said closed position and out of contact with the electrodes of an electric part positioned in said part holding position;

contact shutter means operatively connected to said contacts for moving said contacts between the open position and the closed position and having a moving plate reciprocally movable laterally in the plane of said moving plate for moving said contacts between the open and closed positions, and an operating lever means connected with said plate for moving said plate;

at least one finger-like latch member mounted in said connector for movement from an engaged position in which a part of said latch member is engaged over the electric part for holding it in the part holding position and a disengaged position in which said latch member is moved away from said part holding position to permit movement of the electric part into and out of said part holding position;

said latch member being operatively engaged by said operating lever means for being moved to said disengaged position when said moving plate moves said contacts to the open position and for being released by said operating lever means to be moved to the engaged position when said moving plate moves said contacts to the closed position.

3. A connector for an electric part, comprising:

contacts movable between a closed position in which said contacts contact electrodes of an electric part positioned in a part holding position in said connector, and an open position spaced from said closed position and out of contact with the electrodes of an electric part positioned in said part holding position;

contact shutter means operatively connected to said contacts for moving said contacts between the open position and the closed position and having a moving plate reciprocally movable laterally in the plane of said moving plate for moving said contacts between the open and closed positions, an operating lever means connected with said plate for moving said plate, and an operating member mounted on said connector for moving in a direction of movement of an electric part into and out of said part holding position and engagable with said operating lever means for moving said contacts;

at least one finger-like latch member mounted in said connector for movement from an engaged position in which a part of said latch member is engaged over the electric part for holding it in the part holding position and a disengaged position in which said latch member is moved away from said part holding position to permit movement of the electric part into and out of said part holding position;

said operating member further being engagable with said finger-like latch member for moving said latch member to the disengaged position when said operating member is moved toward the part holding position and for being disengaged from said latch member when said operating member is moved away from the part holding position for permitting said latch member to be moved to the engaged position.

4. A connector for an electric part, comprising:

contacts movable between a closed position in which said contacts contact electrodes of an electric part positioned in a part holding position in said connector, and an open position spaced from said closed position and out of contact with the electrodes of an electric part positioned in said part holding position;

contact shutter means operatively connected to said contacts for moving said contacts between the open position and the closed position and having a moving plate reciprocally movable laterally in the plane of said moving plate for moving said contacts between the open and closed positions, an operating lever means connected with said plate for moving said plate, and an operating member mounted on said connector for moving in a direction of movement of an electric part into and out of said part holding position and engagable with said operating lever means for moving said contacts;

at least one finger-like latch member mounted in said connector for movement from an engaged position in which a part of said latch member is engaged over the electric part for holding it in the part holding position and a disengaged position in which said latch member is moved away from said part holding position to permit movement of the electric part into and out of said part holding position;

said operating member further being engagable with said finger-like latch member for moving said latch member to the disengaged position when said operating member is moved toward the part holding position and for moving said latch member to the engaged position.

5. A connector for an electric part, comprising:

contacts movable between a closed position in which said contacts contact electrodes of an electric part positioned in a part holding position in said connector, and an open position spaced from said closed position and out of contact with the electrodes of an electric part positioned in said part holding position;

contact shutter means operatively connected to said contacts for moving said contacts between the open position and the closed position and having an operating member mounted on said connector for moving in a direction of movement of an electric part into and out of said part holding position;

at least one finger-like latch member mounted in said connector for movement from an engaged position in which a part of said latch member is engaged over the electric part for holding it in the part holding position and a disengaged position in which said latch member is moved away from said part holding position to permit movement of the electric part into and out of said part holding position;

said operating member being engagable with said finger-like latch member for moving said latch member to the disengaged position when said operating member is moved toward the part holding position and for being disengaged from said latch member when said operating member is moved away from the part holding position for permitting said latch member to be moved to the engaged position.

* * * * *